(12) United States Patent
Hembree

(10) Patent No.: US 6,242,932 B1
(45) Date of Patent: *Jun. 5, 2001

(54) INTERPOSER FOR SEMICONDUCTOR COMPONENTS HAVING CONTACT BALLS

(75) Inventor: David R. Hembree, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,632

(22) Filed: Feb. 19, 1999

(51) Int. Cl.⁷ .................................................. G01R 31/02
(52) U.S. Cl. ............................................................ 324/755
(58) Field of Search .................................. 324/755, 761, 324/765; 439/66–70

(56) References Cited

U.S. PATENT DOCUMENTS

| | | | |
|---|---|---|---|
| 4,950,980 | 8/1990 | Pfaff | 439/296 |
| 5,006,792 | 4/1991 | Malhi et al. | 324/158 F |

(List continued on next page.)

OTHER PUBLICATIONS

Lorenz H. et al., "EPON SU–8: A Low–Cost Negative Resist for Mems", Karl Suss America, Inc., Suss Report, vol. 10, Third/Fourth Quarter, 1996, pp. 1–3.

*Primary Examiner*—Safet Metjahic
*Assistant Examiner*—E P LeRoux
(74) *Attorney, Agent, or Firm*—Stephen A. Gratton

(57) ABSTRACT

An interposer for electrically engaging semiconductor components having contact balls is provided. In a testing embodiment, the interposer configures a test socket for testing semiconductor components with different configurations of contact balls. In an assembly embodiment, the interposer can be used in the fabrication of an electronic assembly, to configure a substrate of the assembly for use with semiconductor components having different configurations of contact balls. The interposer includes a base having external contacts, an interconnect having contacts for electrically engaging the contact balls on the component, and an alignment member for aligning the component to the interconnect. The interconnect contacts can be made using semiconductor fabrication techniques for accommodating small, closely spaced contact balls on the components. In addition, conductors on the base and interconnect can have a "fan out" configuration, which permits contacts on the test socket, or substrate, to have a larger size and pitch than the contact balls on the component.

26 Claims, 7 Drawing Sheets

U.S. PATENT DOCUMENTS

| | | | |
|---|---|---|---|
| 5,021,007 | * 6/1991 | Viaud | 439/497 |
| 5,046,239 | 9/1991 | Miller et al. | 29/852 |
| 5,073,117 | 12/1991 | Malhi et al. | 439/71 |
| 5,172,050 | 12/1992 | Swapp | 324/158 P |
| 5,196,726 | 3/1993 | Nishiguchi et al. | 257/737 |
| 5,329,423 | 7/1994 | Scholz | 361/760 |
| 5,341,564 | 8/1994 | Akhavain et al. | 29/832 |
| 5,483,741 | 1/1996 | Akram et al. | 29/846 |
| 5,500,605 | 3/1996 | Chang | 324/758 |
| 5,519,332 | 5/1996 | Wood et al. | 324/755 |
| 5,559,444 | 9/1996 | Farnworth et al. | 324/754 |
| 5,578,934 | 11/1996 | Wood et al. | 324/758 |
| 5,589,319 | 12/1996 | Katou et al. | 430/288.1 |
| 5,592,736 | * 1/1997 | Akram et al. | 29/842 |
| 5,616,448 | 4/1997 | Kato | 430/283.1 |
| 5,625,298 | 4/1997 | Hirano et al. | 324/754 |
| 5,686,317 | 11/1997 | Akram et al. | 437/8 |
| 5,783,461 | 7/1998 | Hembree | 438/17 |
| 5,796,264 | 8/1998 | Farnworth et al. | 324/758 |
| 5,801,452 | 9/1998 | Farnworth et al. | 257/797 |
| 5,815,000 | 9/1998 | Farnworth et al. | 324/755 |
| 5,844,418 | * 12/1998 | Wood et al. | 324/755 |
| 5,878,485 | 3/1999 | Wood et al. . | |
| 5,896,036 | 4/1999 | Wood et al. . | |
| 5,915,977 | 6/1999 | Hembree et al. . | |
| 5,929,647 | 6/1999 | Akram et al. . | |
| 5,931,685 | 8/1999 | Hembree et al. . | |
| 5,949,242 | 9/1999 | Wood et al. . | |
| 5,962,921 | 10/1999 | Farnworth et al. . | |
| 5,982,185 | 11/1999 | Farnworth . | |
| 6,016,060 | 1/2000 | Akram et al. . | |
| 6,018,249 | 1/2000 | Akram et al. . | |
| 6,025,728 | 2/2000 | Hembree et al. . | |
| 6,025,731 | 2/2000 | Hembree et al. . | |
| 6,040,702 | 3/2000 | Hembree et al. . | |
| 6,060,893 | 5/2000 | Farnworth et al. . | |
| 6,060,894 | 5/2000 | Hembree et al. . | |
| 6,072,323 | 6/2000 | Hembree et al. . | |
| 6,072,326 | 6/2000 | Akram et al. . | |
| 6,091,251 | 6/2000 | Wood et al. . | |
| 6,091,252 | 7/2000 | Akram et al. . | |
| 6,094,058 | 7/2000 | Hembree et al. . | |
| 6,130,148 | 10/2000 | Farnworth et al. . | |
| 6,175,241 | 1/2001 | Hembree et al. . | |

* cited by examiner

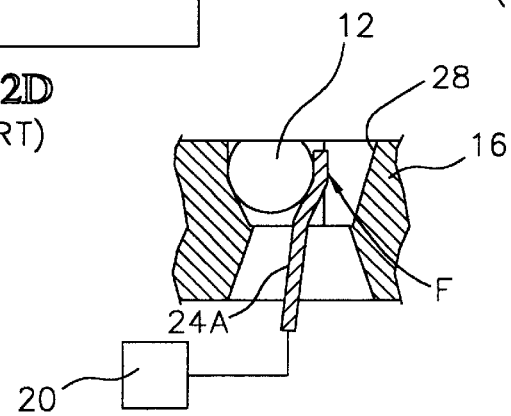
FIGURE 2D
(PRIOR ART)
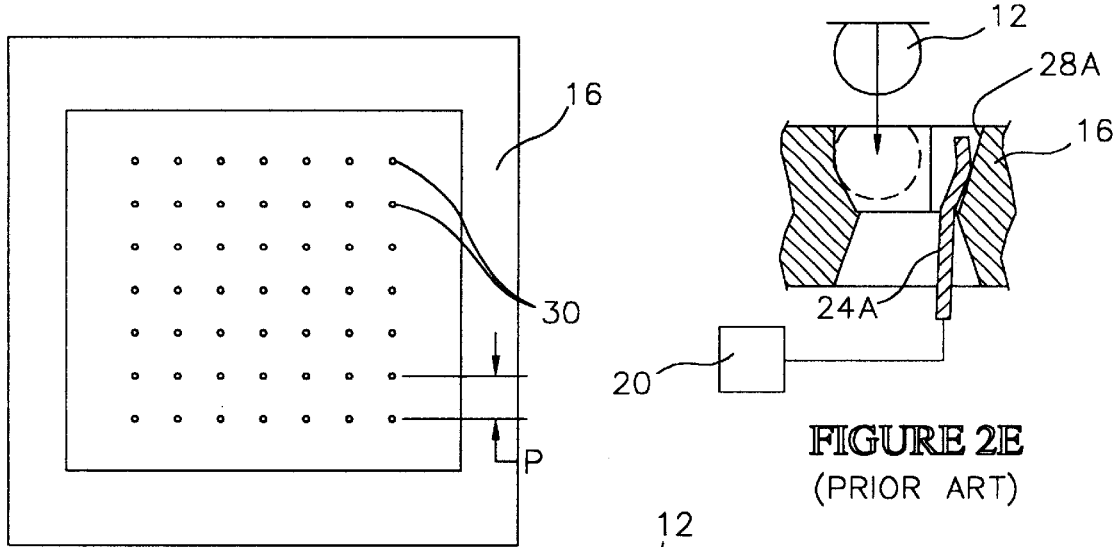
FIGURE 2E
(PRIOR ART)
FIGURE 2F
(PRIOR ART)
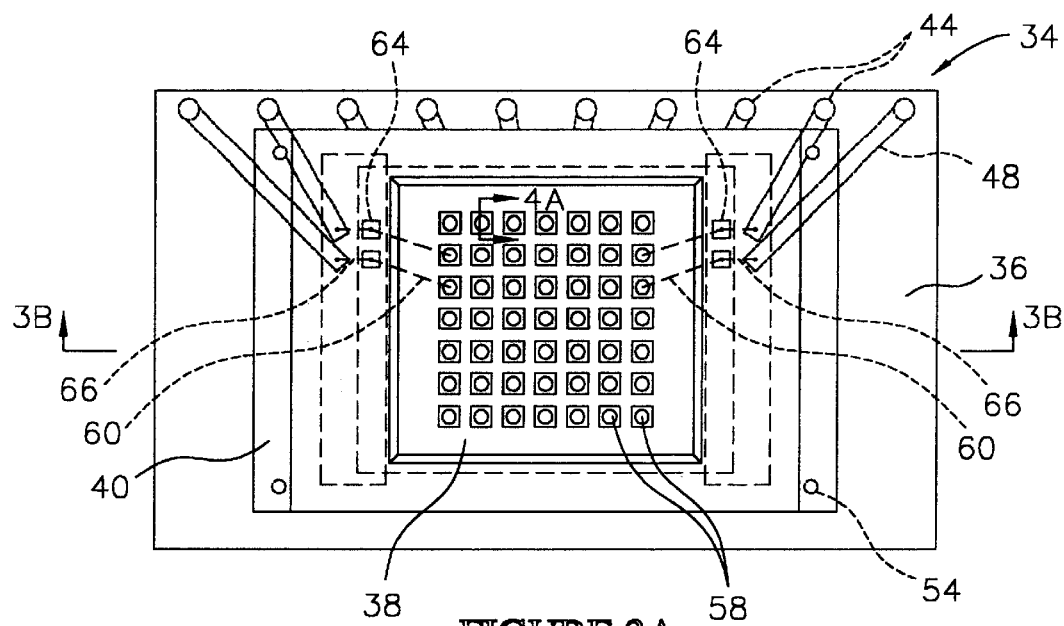
FIGURE 3A

INTERPOSER FOR SEMICONDUCTOR COMPONENTS HAVING CONTACT BALLS

FIELD OF THE INVENTION

This invention relates generally to the testing and assembly of semiconductor components, such as semiconductor dice and packages having contact balls. More particularly, this invention relates to an interposer for electrically engaging semiconductor components having contact balls.

BACKGROUND OF THE INVENTION

Ball grid array technology is increasingly employed in the manufacture of high performance semiconductor components requiring a high input/output capability. A ball grid array semiconductor component includes external contacts in the form of balls arranged in a dense grid pattern (e.g., rows and columns). Exemplary ball grid array semiconductor components include BGA packages, chip scale packages, and bumped bare dice.

The balls in the ball grid array can have different shapes, such as spherical, hemispherical, or dome. Typically the balls comprise solder, which permits the semiconductor components to be surface mounted, or alternately flip chip mounted, to a mating component such as a printed circuit board.

Recent developments in ball grid array technology permit the balls to be made smaller and with tighter pitches. For example, for fine ball grid array (FGBA) components, the balls can have a diameter as small as about 0.127 mm (0.005 inch), and a center to center pitch as small as about 0.228 mm (0.008 inch). As the balls become smaller and closer, it becomes more difficult to make electrical connections with the balls for testing and for surface mounting the components in the fabrication of electronic assemblies.

For testing applications, sockets are typically employed to hold the components, and to make the temporary electrical connections with the contact balls on the components. The socket then interfaces with a test board, or other substrate, in electrical communication with test circuitry.

FIGS. 1A and 1B illustrates a prior art component 10 that includes contact balls 12. As used herein the term "contact balls" refers to external contacts on the component 10 in electrical communication with integrated circuits or other electrical elements contained on the component 10. The contact balls 12 can have any conventional shape that provides a raised contact surface. By way of example, representative shapes include spherical, hemispherical, dome, bump and conical. In addition, the contact balls 12 have a diameter "D" and a pitch "P". A representative range for the diameter D can be from about 0.127 mm (0.005 inch) to 0.762 mm (0.030 inch). A representative range for the pitch P can be from about 0.228 mm (0.008 inch) to 2.0 mm (0.078 inch).

FIG. 2A illustrates a prior art test system 14 for testing the component 10. The test system 14 includes multiple sockets 16 mounted to test sites 22 on a test board 18. Each socket 16 is designed to hold a component 10.

As shown in FIG. 2B, the test sites 22 on the socket 16 include contacts 24 in electrical communication with test circuitry 20. The contacts 24 are adapted to make temporary electrical connections with the contact balls 12 on the component 10. In the embodiment illustrated in FIG. 2B the contacts 24 are mounted in openings 28 in the socket 16 and include y-shaped segments 26 that physically and electrically engage the contact balls 12. A force applying mechanism (not shown) associated with the socket 16 presses the component 10 against the contacts 24 with a force F. This permits native oxide layers on the contact balls 12 to be penetrated by the y-shaped segments 26. In addition to the y-shaped segments 26, the contacts 24 on the socket 16 also include terminal segments 30 that plug into electrical connectors 32 in the test board 18. As shown in FIG. 2C, the pitch P of the contacts 24 matches the pitch P (FIG. 1B) of the contact balls 12. As shown in FIG. 2D, the pitch P of the terminal segments 30 of the contacts 24 also matches the pitch P (FIG. 1B) of the contact balls 12. This type of contact 24 is sometimes described as a "straight through" contact.

Alternately, as shown in FIGS. 2E and 2F, another type of contact 24A is adapted to exert a force F on the contact balls 12. As shown in FIG. 2E, an opening 28A receives the contact ball 12 with the contact 24A in an unactuated position with a zero insertion force. As shown in FIG. 2F, actuation of the contact 24A presses the contact 24A against the contact ball 12 with a force F. The contact 24A can be constructed with a mechanical lever or rocker as is known in the art. This type of contact 24A is adapted to exert a wiping action on the contact ball 12 which breaks through native oxide layers.

One problem with the conventional socket 16 is that it is difficult to accommodate contact balls 12 having a pitch of less than about 0.65 mm. Specifically, the contacts 24 (or 24A) cannot be made as small, or as close, as the contact balls 12. This is especially true with sockets having "straight through" contacts 24. Also, components that mate with the socket 16, such as the test board 18, must include mating electrical connectors 32 for the contacts 24 (or 24A). The mating electrical connectors 32 may require more space to fabricate than the contacts 24 (or 24A), making fabrication of the test board 18 difficult.

Another problem with the conventional socket 16 is that the contacts 24 (or 24A) can only make electrical connections with one size and pitch of contact balls 12. Often times a component 10 will be initially manufactured with contact balls 12 having a relatively large size (e.g., 0.40 mm) and pitch (e.g., 1.0 mm). However, due to design and fabrication process improvements, the size and pitch of the contact balls 12 will shrink. This requires that the socket 16 be redesigned and replaced each time the component 10 changes. This type of socket 16 is expensive to make, and becomes more expensive as the size and pitch of the contact balls 12 decreases. The test boards 18 for the sockets 16 must also be redesigned to accommodate the replacement sockets. In general, redesign and replacement of the sockets and test boards represents a significant expense for semiconductor manufacturers.

The present invention is directed to an interposer which configures test sockets for testing components having different sizes and pitches of contact balls. In addition, the interposer permits test sockets to be constructed with external contacts having a pitch that is greater than a pitch of the contact balls on the component. The interposer can also be utilized in assembly applications for modifying electronic assemblies to accommodate components having different contact balls.

SUMMARY OF THE INVENTION

In accordance with the present invention, an interposer for electrically engaging semiconductor components having contact balls is provided. The interposer can be used to fabricate test sockets and test systems, and to perform test methods. In addition, the interposer can be used in the fabrication of electronic assemblies wherein semiconductor components having contact balls are mounted to a mating substrate, such as a printed circuit board.

The interposer, broadly stated, comprises: a base with external contacts; compromising balls an interconnect on the base for electrically engaging contact balls on a semiconductor component; and an alignment member on the base for aligning the component to the interconnect.

In a test embodiment, the interposer configures a test socket for testing semiconductor components having contact balls. In addition, the interposer is interchangeable with other interposers adapted to electrically engage contact balls on other components. This permits the same test socket to be used with different interposers to test components having different configurations of contact balls. Accordingly, the interposer can be "tailored" for a particular component, while the test socket remains "universal" in character.

In an assembly embodiment, the interposer configures a substrate (e.g., PCB) of an electronic assembly for electrically engaging different types of semiconductor components. In this embodiment, the interposer surface mounts to the substrate and provides electrical interface between the substrate and the components. This allows the substrate to be modified to accept components having different configurations of contact balls. For example, an existing electronic assembly, such as a multi chip module, can be configured by the interposer to accept redesigned versions of semiconductor components.

The interconnect includes interconnect contacts in electrical communication with the external contacts on the base. The interconnect contacts make electrical connections with the contact balls on the component. In the test embodiment, the interconnect contacts can include conductive layers that will not form permanent bonds with the contact balls on the component. In the assembly embodiment, the interconnect contacts can include conductive layers, such as solder wettable metals, that will form permanent bonds with the contact balls.

Several different embodiments are provided for the interconnect contacts including: conductive pockets configured to retain and electrically engage the contact balls; conductive pockets having penetrating blades configured to penetrate the contact balls; conductive projections configured to retain and penetrate the contact balls; conductive pockets formed in a compliant layer; conductive pads having openings for retaining the contact balls; and patterns of conductive projections configured to retain the contact balls therebetween.

In each embodiment the interconnect contacts can be made small (e.g., 0.127 mm) and with a close pitch (e.g., 0.228 mm) using semiconductor circuit fabrication techniques, such as photolithography, etching and metallization processes. In addition, conductors on the interconnect and base of the interposer can have a "fan out" configuration. This permits the external contacts on the interposer base, and the mating contacts on the test socket or substrate, to have a greater pitch than the contact balls on the component. In addition, test socket contacts can have a "straight through" configuration.

The alignment member of the interposer includes a peripheral opening for aligning the semiconductor component to the interconnect. In addition, the alignment member can include alignment openings for aligning the contact balls on the component to the interconnect contacts. The alignment member can comprise a separate plate formed of silicon, ceramic, metal, epoxy or plastic, which is attached to the base of the interposer. Alternately, the alignment member can comprise a photoimageable polymer layer which is deposited on the base of the interposer, patterned with alignment openings, and then cured.

A test method performed in accordance with the invention includes the steps of: providing a test socket with the interposer, aligning and forming electrical connections with contact balls on the component using the interposer, and then applying test signals through the test socket and interposer to the component. The test method can also include the step of replacing the interposer with a second interposer configured for testing a second component, and then testing the second component by applying test signals through the test socket and second interposer.

BRIEF DESCRIPTION OF THE DRAWINGS

FIG. 2D is a schematic cross sectional view taken along section line 2D—2D of FIG. 2B illustrating terminal segments of the contacts on the test socket;

FIG. 2E is a schematic cross sectional view illustrating an alternate embodiment contact for the test system in an unactuated position;

FIG. 2F is a schematic cross sectional view of the alternate embodiment contact in an actuated position;

FIG. 3A is an enlarged schematic plan view of an interposer constructed in accordance with the invention;

DETAILED DESCRIPTION OF THE PREFERRED EMBODIMENTS

Figure 3B:
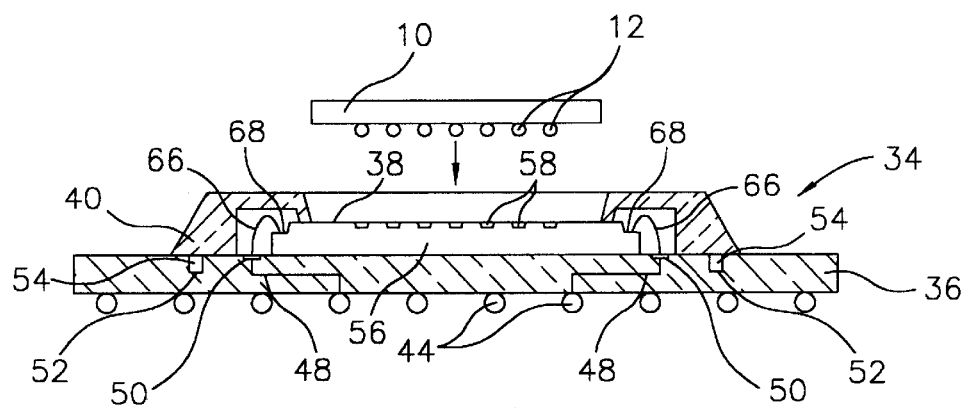
FIG. 3B is a cross sectional view of the interposer taken along section line 3B—3B of FIG. 3A.

Referring to FIGS. 3A and 3B, an interposer 34 constructed in accordance with the invention is illustrated. The interposer 34 includes a base 36, an interconnect 38, and an alignment member 40. The interposer 34 can be used to fabricate a test socket 92 (FIG. 7A) for testing different types of semiconductor components 10.

Figure 7A:
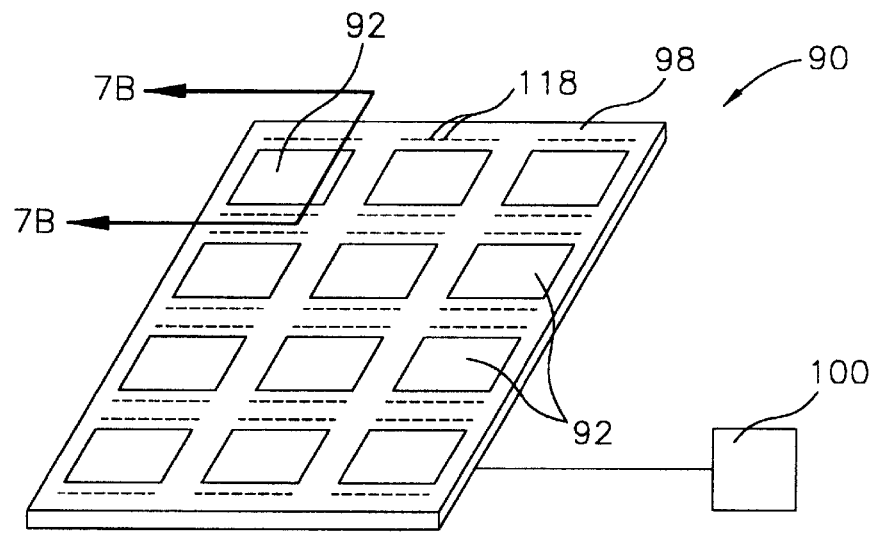
FIG. 7A is a schematic perspective view of a test system constructed in accordance with the invention.

The base 36 includes external contacts 44 adapted for electrical engagement by contacts 46 (FIG. 7A) on the test socket 92 (FIG. 7A). In addition, the base 36 includes conductors 48 and bond pads 50 in electrical communication with the external contacts 44. The base 36 also includes pockets 52 for retaining pins 54 on the alignment member 40.

The conductors 48 can be formed of highly conductive metals such as aluminum, iridium, copper, gold, tungsten, tantalum, molybdenum or alloys of these metals. The bond pads 50 can comprise a wire bondable metal, such as copper or aluminum. The conductors 48 can be formed on a surface of the base 36 using a metallization process. In addition, the conductors 48 can be formed internally within the base 36 by deposition of a metal into etched or machined vias. As clearly shown in FIG. 3A, the conductors 48 "fan out" to the external contacts 44.

Preferably the base 36 comprises an electrically insulating material, such as a ceramic, or a glass filled resin (e.g. FR–4). In addition, the base 36 can be formed with required features, such as conductors 48, bond pads 50 and external contacts 44 using known processes employed in the manufacture of circuit boards and other electronic components.

As shown in FIGS. 3A and 3B, the interconnect 38 includes a substrate 56, and a pattern of interconnect contacts 58 on the substrate 56. The interconnect contacts 58 are adapted to make temporary electrical connections with the contact balls 12 on the component 10. Accordingly, the interconnect contacts 58 have a size and pitch which correspond to the size and pitch of the contact balls 12 on the component 10. In addition to the patterns of interconnect contacts 58, the interconnect 38 includes patterns of conductors 60 (FIG. 3A) on the substrate 56 in electrical communication with the interconnect contacts 58. The conductors 60 provide conductive paths to the interconnect contacts 58. As with the conductors 48 (FIG. 3A) on the base 36, the conductors 60 on the interconnect 38 can have a "fan out" configuration.

Preferably, the interconnect substrate 56 comprises silicon, which permits the interconnect contacts 58 and conductors 60 to be made using semiconductor fabrication techniques (e.g., photolithography, etching, metallization). In addition, with silicon, a coefficient of thermal expansion (CTE) of the interconnect 38 matches that of the component 10. However, the interconnect substrate 56 can also comprise ceramic, glass filled resin (e.g., FR-4), silicon-on-glass, or another semiconductor such as gallium arsenide.

Also, the interconnect substrate 56 is preferably thick enough to resist deflection and buckling during test procedures performed using the interposer 34. In addition, an electrically insulating layer 62 (FIG. 4A), such as $SiO_2$, polyimide, epoxy, plastic or BPSG can be formed on the interconnect substrate 56 to provide insulation for the interconnect contacts 58 and conductors 60.

The conductors 60 can be formed on a surface of the substrate 56 in a required pattern. Preferably, the conductors 60 comprise a highly conductive metal such as copper, aluminum, titanium, tantalum, tungsten, molybdenum or alloys of these metals. The conductors 60 can be formed as a single layer of metal, or as a multi metal stack, using a thin film metallization process (e.g., CVD, patterning, etching or electroplating). Alternately, a thick film metallization process (e.g., screen printing, stenciling) can be used to form the conductors 60.

The conductors 60 also include bond pads 64 located along the peripheral edges of the interconnect 38. Wires 66 are wire bonded to the bond pads 64 on the interconnect 38 and to the bond pads 50 on the base 36 to provide separate electrical paths therebetween. Preferably the bond pads 64 are located on recessed surfaces 68 (FIG. 3B) along the edges of the interconnect substrate 56 to provide clearance for the wires 66. Alternately, rather than wire bonding wires 66, TAB tape can be used to electrically connect the interconnect 38 to the base 36.

Figure 4A:
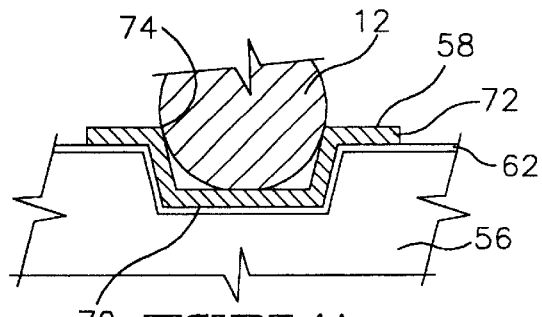
FIG. 4A is an enlarged cross sectional view taken along section line 4A—4A of FIG. 3A showing a contact on the interposer electrically engaging a contact ball on a component.

Referring to FIG. 4A, an interconnect contact 58 is illustrated in greater detail. The interconnect contact 58 includes a pocket 70 formed in the interconnect substrate 56, and a conductive layer 72 formed on the pocket 70. The pocket 70 can be etched by forming a mask (not shown) on the interconnect substrate 56, such as a photopatterned resist mask, and then etching the interconnect substrate 56 through openings in the mask, using an etchant. With the interconnect substrate 56 comprising silicon, a suitable etchant for performing the etch process comprises a solution of KOH.

Figure 1A:
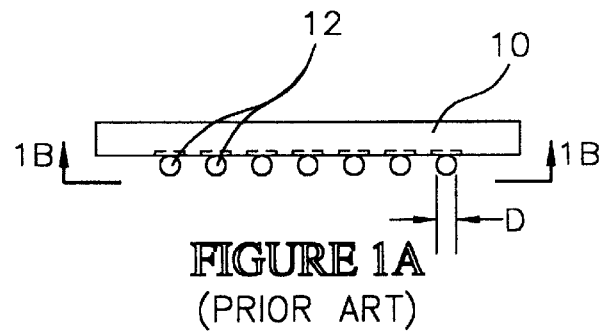
FIG. 1A is a schematic side elevation view of a prior art semiconductor component having contact balls.
Figure 1B:
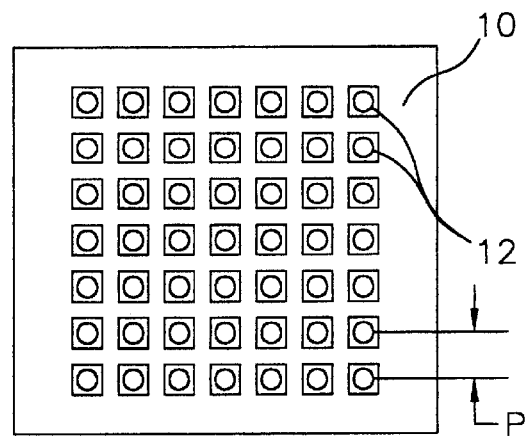
FIG. 1B is a bottom view of the component taken along section line 1B—1B of FIG. 1A.

A size and shape of the pocket 70 will be determined by the openings in the etch mask used to etch the interconnect substrate 56. The pocket 70 is sized and shaped to retain and electrically engage a single contact ball 12. A representative diameter, or width, of the pocket 70 can be from 2 mils to 50 mils or more. This diameter can be less than a diameter of the contact ball 12 so that only portions thereof will be contacted. A depth of the pocket 70 can be equal to or less than the diameter of the pocket 70. A pitch or spacing of the pocket 70 relative to adjacent pockets 70 will exactly match a pitch P (FIG. 1B) of the contact balls 12.

Still referring to FIG. 4A, the conductive layer 72 can comprise a layer of a highly conductive metal such as aluminum, titanium, nickel, iridium, copper, gold, tungsten, silver, platinum, palladium, tantalum, molybdenum or alloys of these metals. The conductive layer 72 can be formed on the insulating layer 62 to a desired thickness using a suitable metallization process (e.g., CVD, photopatterning, etching or electroplating) . Peripheral edges 74 of the conductive layer 72 are adapted to penetrate native oxide layers on the contact balls 12 to contact the underlying metal.

In addition, the conductive layer 72 is in electrical communication with a selected conductor 60 (FIG. 3A) on the interconnect substrate 56. The conductive layers 72 and conductors 60 can be formed using a same metallization process or using different metallization processes. In addition, the conductive layers 72 and conductors 60 can be formed as multi-layered stacks of metals (e.g., bonding layer/barrier layer). Still further, the conductors 60 can be electrically insulated with an outer insulating layer (not shown).

Further details of the interconnect contact 58 are described in U.S. patent application Ser. No. 08/829,193, now U.S. Pat. No. 5,962,921, entitled "INTERCONNECT HAVING RECESSED CONTACT MEMBERS WITH PENETRATING BLADES FOR TESTING SEMICONDUCTOR DICE AND PACKAGES WITH CONTACT BUMPS", incorporated herein by reference.

Figure 4B:
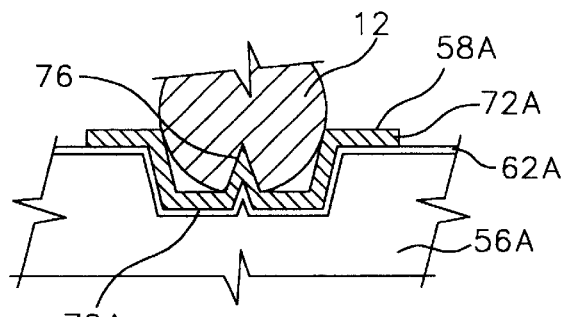
FIG. 4B is an enlarged cross sectional view equivalent to FIG. 4A of an alternate embodiment contact on the interposer.

Referring to FIG. 4B, a second embodiment interconnect contact 58A is illustrated. The interconnect contact 58A includes a pocket 70A formed in a substrate 56A. In addition, the interconnect contact 58A includes an insulating layer 62A, and a conductive layer 72A. Each of these elements are substantially similar to the previously described elements of interconnect contact 58 (FIG. 4A).

The interconnect contact 58A also includes a penetrating blade 76 configured to penetrate into the contact ball 12 to form a low resistance electrical connection therewith. Further details of the interconnect contact 58A are described in previously cited U.S. patent application Ser. No. 08/829,193.

Figure 4C:
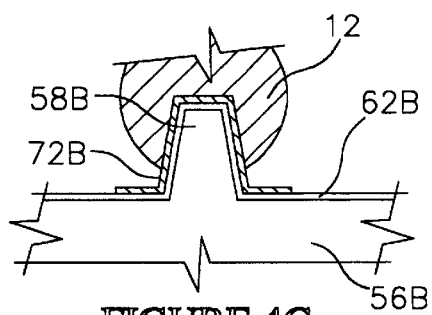
FIG. 4C is an enlarged cross sectional view equivalent to FIG. 4A of another alternate embodiment contact on the interposer.

Referring to FIG. 4C, a third embodiment interconnect contact 58B comprises a projection formed integrally with a substrate 56B, which preferably comprises silicon or other etchable material. One method for forming the interconnect contact 58B is by etching the substrate 56B as described in U.S. Pat. No. 5,483,741, entitled "METHOD FOR FABRICATING A SELF LIMITING SILICON BASED INTERCONNECT FOR TESTING BARE SEMICONDUCTOR DICE", which is incorporated herein by reference. The interconnect contact 58B includes a conductive layer 72B formed using a metallization process as previously described. The conductive layer 72B is in electrical communication with a selected conductor 60 (FIG. 3A) on the substrate 56B. In addition, an insulating layer 62B can be formed on the substrate 56B to electrically insulate the conductive layer 72B from the bulk of the substrate 56B.

The interconnect contact 58B is adapted to penetrate into the contact ball 12 to form an electrical connection therewith. In FIG. 4C, the interconnect contact 58B is shown as penetrating a center of the contact ball 12, forming a void therein. However, penetration can be along the peripheral edges of the contact ball 12 in which case a groove would be formed.

Figure 4D:
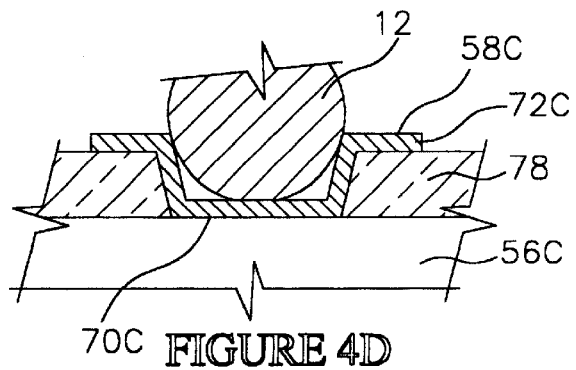
FIG. 4D is an enlarged cross sectional view equivalent to FIG. 4A of another alternate embodiment contact on the interposer.

Referring to FIG. 4D, a fourth embodiment interconnect contact 58C comprises a pocket 70C covered with a conductive layer 72C in electrical communication with a selected conductor 60 (FIG. 3A), substantially as previously described. However in this embodiment, the pocket 70C is formed on an elastomeric layer 78 formed on a substrate 56C. The elastomeric layer 78 comprises a compliant polymer material that allows the interconnect contact 58C to move in the z-direction to accommodate variations in the size, location, and planarity in the contact balls 12.

Suitable materials for the elastomeric layer 78 include polyimide, photoimageable polyimide, polyester, epoxy, urethane, polystyrene, silicone and polycarbonate. These materials can be cast in place to a desired thickness using known processes such as spin on, by dispensing through a nozzle, or by molding. Alternately, these materials can be in the form of a tape, such as "KAPTON" tape, which can be applied to the substrate 56C using an adhesive layer. A representative thickness for the elastomeric layer 78 can be from $0.5\mu m$ to $200\mu m$ or more.

Figure 4E:
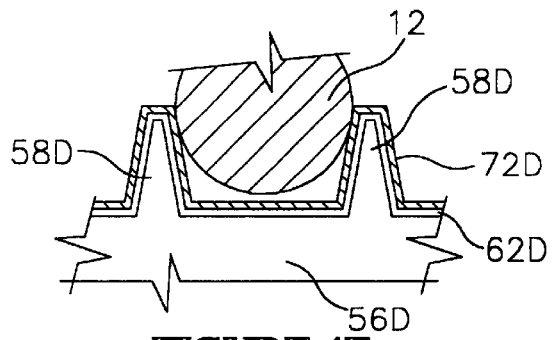
FIG. 4E is an enlarged cross sectional view equivalent to FIG. 4A of another alternate embodiment contact on the interposer.

Referring to FIG. 4E, a fourth embodiment interconnect contact 58D includes an array of projections formed on a substrate 56D and configured to retain the contact ball 12 therebetween. By way of example, the contact 58D can include two, three, four or more projections spaced by a distance that is less than a diameter of the contact ball 12. The interconnect contact 58D also includes an insulating layer 62D and a conductive layer 72D which function substantially as previously described.

Figure 4F:
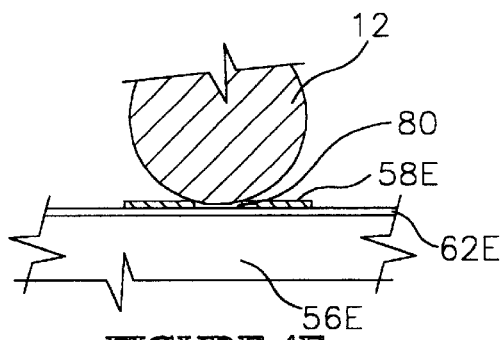
FIG. 4F is an enlarged cross sectional view equivalent to FIG. 4A of another alternate embodiment contact on the interposer.

Referring to FIG. 4F, a fifth embodiment interconnect contact 58E comprises a conductive pad on a substrate 56E having an opening 80 for retaining the contact ball 12. As before, an insulating layer 62E insulates the contact 58E and associated conductor 48 (FIG. 3B).

Figure 5:
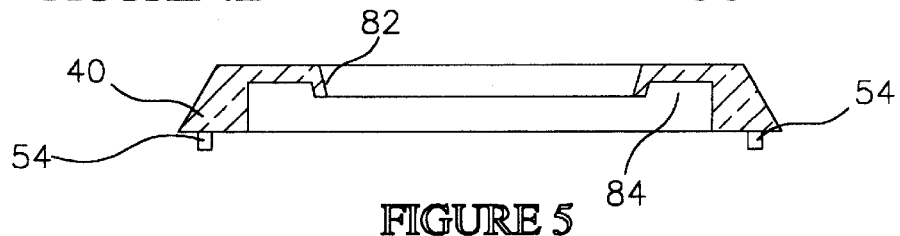
FIG. 5 is a cross sectional view of an alignment member for the interposer of FIGS. 3A and 3B, shown separately.

Referring to FIG. 5, the alignment member 40 is illustrated separately. The alignment member 40 is adapted to align the component 10 with the interconnect 38 such that the contact balls 12 on the component 10 electrically engage the interconnect contacts 58. In the embodiment of FIG. 5, the alignment member 40 comprises a separate plate formed of silicon, ceramic, plastic, metal, epoxy or FR-4. The alignment member 40 includes an alignment opening 82 having a peripheral outline that is slightly larger than a peripheral outline of the semiconductor component 10. The alignment opening 82 includes sloped sidewalls, adapted to contact the outside edges of the component 10, to guide the component 10 onto the interconnect 38.

The alignment member 40 can also include pins 54, adapted for mating engagement with corresponding pockets 52 in the base 36. If desired, an adhesive can be used to secure the alignment member 40 to the base 36. In addition, the alignment member 40 can include recesses 84 shaped to enclose and protect the bond wires 66 (FIG. 3B), and associated wire bonds.

With the alignment member 40 formed of silicon, an anisotropic etch using KOH or other etchant can be performed to form the alignment opening. In addition, electrically insulating layers (e.g., $SiO_2$, $Si_3N_4$, polyimide etc.) can be formed on the alignment member 40 as required, using a deposition or growth process, to insulate the alignment member 43 or portions thereof. A suitable method for forming the alignment member 40 is described in U.S. Pat. No. 5,559,444, entitled "Method And Apparatus For Testing Unpackaged Semiconductor Dice", incorporated herein by reference.

Figure 6A:
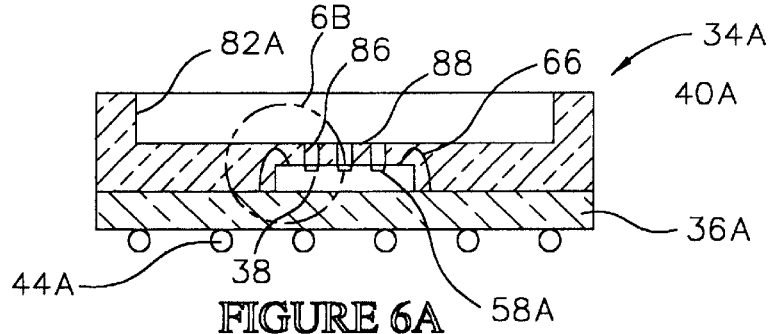
FIG. 6A is a schematic cross sectional view of an alternate embodiment interposer having a deposited alignment member.
Figure 6B:
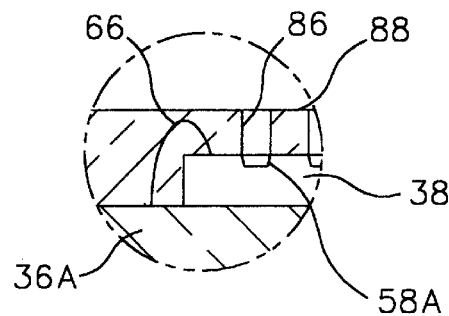
FIG. 6B is an enlarged schematic cross sectional view taken along section line 6B of FIG. 6A.

Referring to FIGS. 6A and 6B, an alternate embodiment interposer 34A is illustrated. The interposer 34A includes a base 36A and an interconnect 38A constructed substantially as previously described for base 36 (FIG. 3A) and interconnect 38 (FIG. 3A). In addition, the interconnect 38A includes contacts 58A, formed substantially as previously described, for electrically engaging the contact balls 12.

The interposer 34A also includes a polymer alignment member 40A for aligning the component 10 to the interconnect 38A. The polymer alignment member 40A comprises a polymer material, such as epoxy or plastic, that is deposited on the base 36A in a viscous, or liquid state, and then hardened by curing. Preferably the polymer material comprises a photoimageable material, such as a thick film resist, such that a photolithographic process can be used to locate and then etch openings in the polymer material.

The alignment member 40A includes an alignment opening 82A sized and shaped to contact the peripheral edges of the component 10 to align the component 10 to the interconnect 38A. The alignment member 40A also includes a pattern of openings 86 formed in a polymer layer 88. The openings 86 are sized and shaped to align the contact balls 12 to the interconnect contacts 58. In addition, the polymer layer 88 encapsulates and protects bond wires 66 which provide electrical paths between the interconnect contacts 58 and external contacts 44A on the base 36A, substantially as previously described.

One suitable polymer for forming the alignment member 40A comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 0.5–20 mils and then built up using successive layers to form the alignment member 40A with a desired thickness. A conventional resist coating apparatus, such as a spin coater, can be used to deposit the resist onto the base 36A. The deposited resist can then be "prebaked" at about 95° C. for about 15 minutes and exposed in a desired pattern using a conventional UV aligner with a dose of about 165 mJ/cm$^2$. Developing can be accomplished with a solution of PGMEA (propylenglycol-monomethylether-acetate). This can be followed by a hard bake at about 200° C. for about 30 minutes.

U.S. patent application Ser. No. 08/988,433, now U.S. Pat. No. 6,018,249 filed Dec. 11,1997, entitled, "Test System With Mechanical Alignment For Semiconductor Chip Scale Packages And Dice", which is incorporated herein by reference, describes a method for fabricating the polymer alignment member 40A, using the above resist formulation.

Rather than resist, the alignment member 40A can comprise a photoimageable polyimide which can be patterned using UV and then developed using a developer solution. Photosensitive polyimide compositions are commercially available, and are described in U.S. Pat. Nos. 5,589,319 and 5,616,448.

Figure 7B:
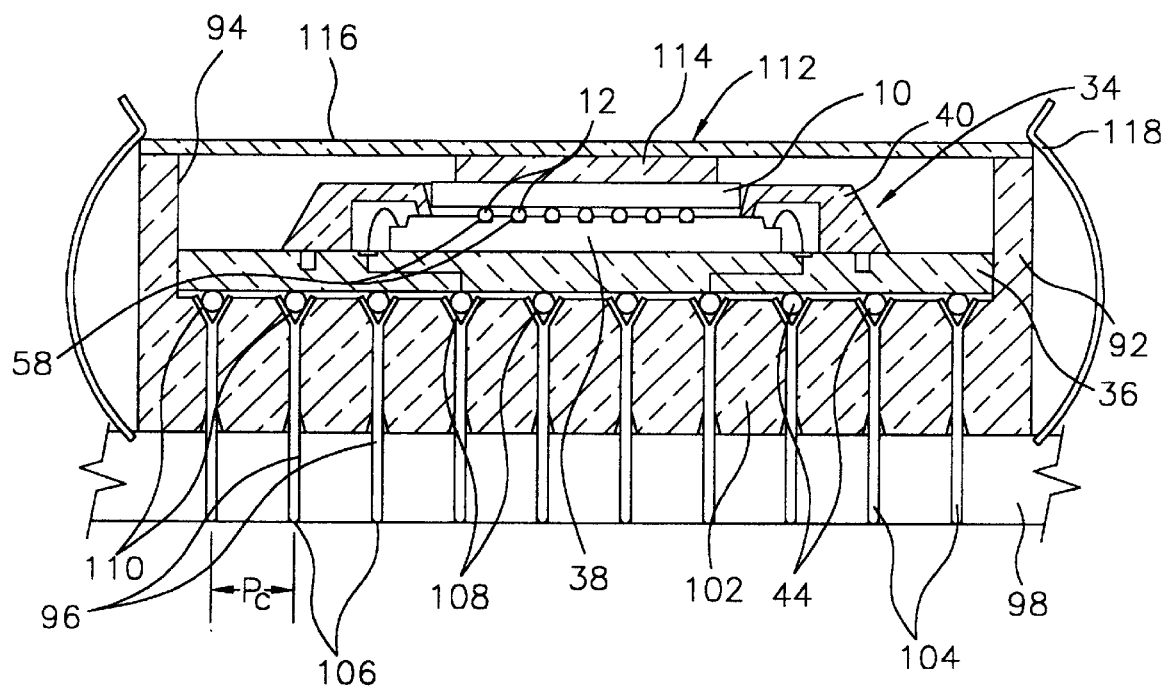
FIG. 7B is a cross sectional view taken along section line 7B—7B of FIG. 7A illustrating a socket constructed in accordance with the invention.

Referring to FIGS. 7A and 7B, a test system 90 (FIG. 7A) and a test socket 92 (FIG. 7B) constructed using the interposer 34 (FIG. 3B) are illustrated. As shown in FIG. 7A, the test system 90 includes a test board 98 in electrical communication with test circuitry 100. In addition, the test system 90 includes a plurality of test sockets 92 mounted to the test board 98 in electrical communication with the test circuitry 100.

Figure 2A:
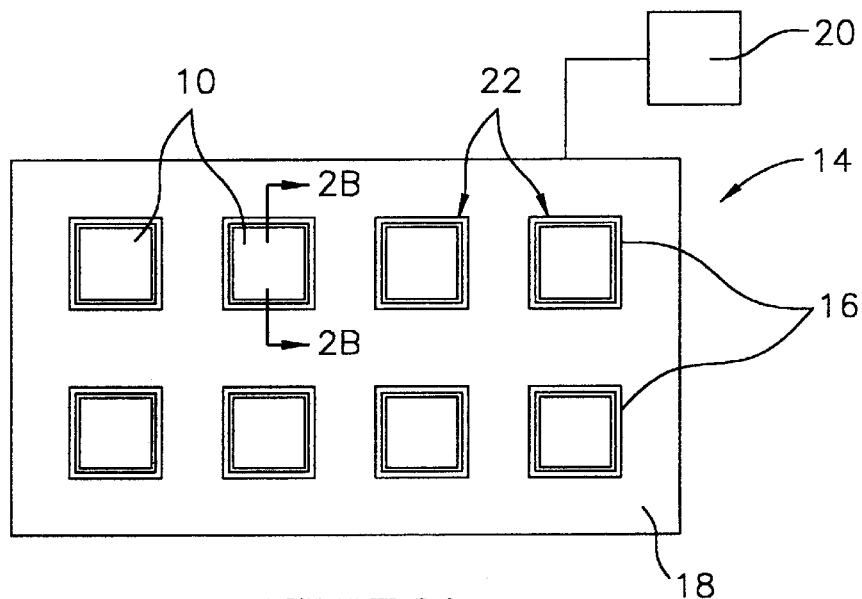
FIG. 2A is a schematic plan view of a prior art test system for testing semiconductor components having contact balls.
Figure 2B:
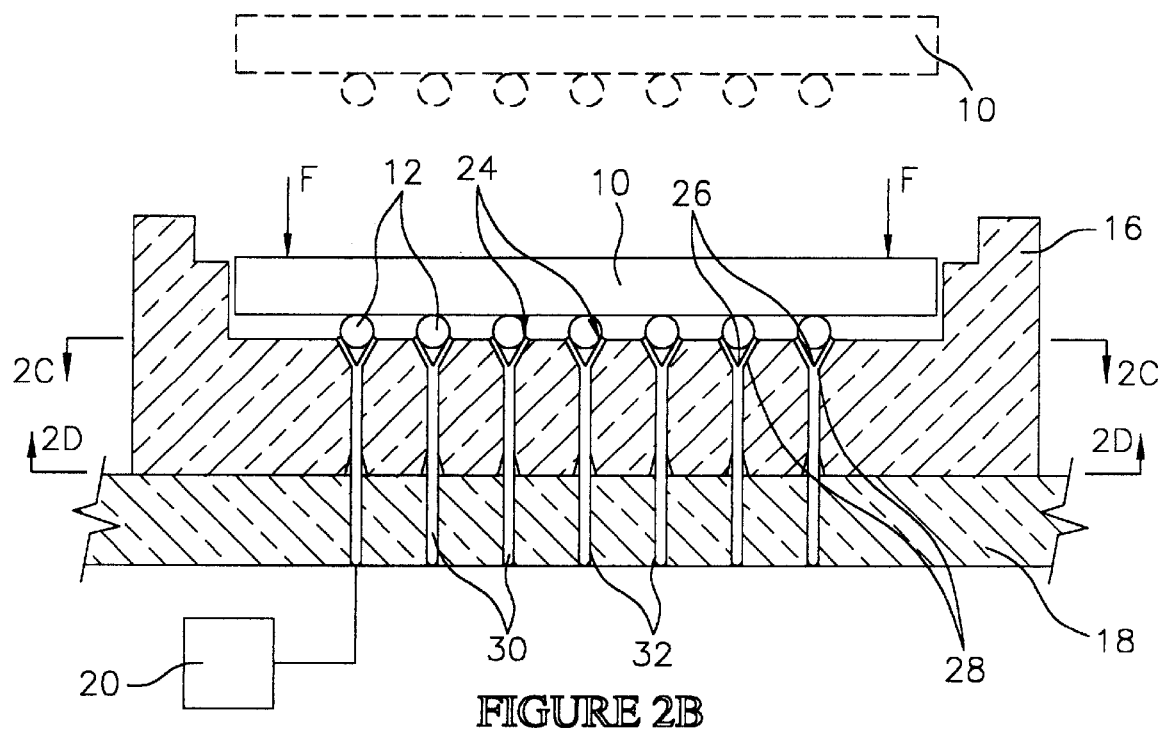
FIG. 2B is a schematic cross sectional view taken along section line 2B—2B of FIG. 2A illustrating a test socket of the test system mounted to a test board.
Figure 2C:
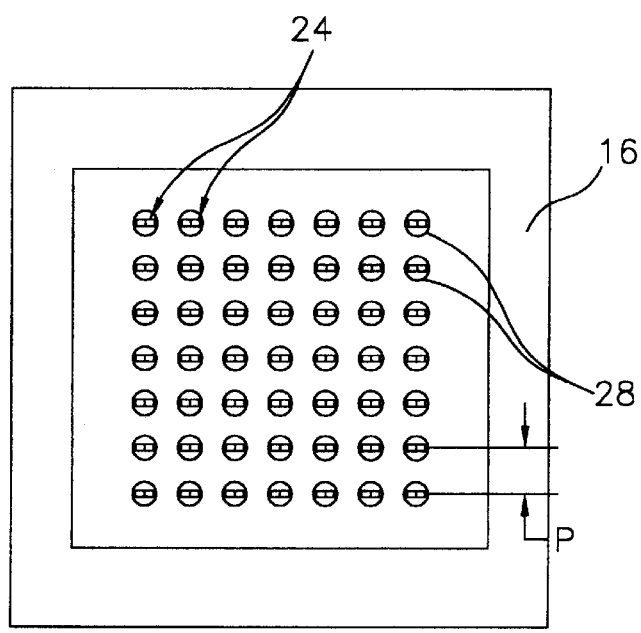
FIG. 2C is a schematic cross sectional view taken along section line 2C—2C of FIG. 2B illustrating contacts on the test socket.

As shown in FIG. 7B, the test socket 92 includes a cavity 94 wherein the interposer 34 is mounted. The test socket 92 also includes a socket base 102, and a plurality of contacts 96 in the socket base 102 for electrically engaging the external contacts 44 on the interposer base 36. The contacts 96 are "straight through" contacts substantially as previously described for contacts 24 (FIG. 2B). In addition, the contacts 96 include terminal segments 104 that electrically engage electrical receptacles 106 in the test board 98. The terminal segments 104 can be formed in a dense grid array such as a pin grid array (PGA). The contacts 96 also include y-shaped segments 108 located in openings 110 in the socket base 102. The y-shaped segments 108 are configured to electrically engage the external contacts 44 on the interposer base 36.

As also shown in FIG. 7B, the test socket 92 includes a force applying mechanism 112 for biasing the component 10 against the interconnect 38 of the interposer 34. The force applying mechanism 112 includes an elastomeric biasing member 114, a pressure plate 116, and clips 118.

The elastomeric biasing member 114 is compressed by the pressure plate 116 during assembly of the test socket 92 such that the component 10 is pressed against the interconnect 38. This pressure, or biasing force, maintains the temporary electrical connections between the contact balls 12 and the interconnect contacts 58. Representative materials for the biasing member 114 include silicone, butyl rubber, flourosilicone, and polyimide. A representative hardness for the biasing member 114 can be from about 30–90 (Shore A), and preferably about 60–70 (Shore A).

Alternately a metal or plastic spring can be used in place of the elastomeric biasing member 114. Also for some applications, the biasing member 114 can comprise an elastomeric polymer filled with conductive particles. For example, compounds can include silicone or fluorosilicone filled with conductive particles, such as C, Ag, Cu, Al, Cu, and Ni. Conductive polymer materials are commercially available from Chomerics.

The clips 118 comprise resilient members attached to the test board 98. Alternately the clips 118 can be attached to the test socket 92 rather than to the test board 98. The clips 118 are sized and shaped to retain the pressure plate on the test socket 92.

The interposer 34 is configured to align and electrically engage the component 12. In addition, the interposer 34 establishes electrical communication between the contact balls 12 on the component 10, and the contacts 96 on the test socket 92. For testing different types of components, the interposer 34 can be removed, and a second interposer mounted to the test socket 92. However, the configuration of the test socket 92, of the contacts 96 on the test socket 92, and of the electrical receptacles 106 on the test board 98 can remain the same (i.e., standardized). This permits the test socket 92 and test system 90 to be "universal" in character (i.e., adapted to test different types of components) while the interposer 34 is "customized" for a particular component.

Another advantage of the interposer 34 is that components having closely spaced (e.g., 0.228 mm) contact balls 12 can be electrically engaged by the interconnect 38. On the other hand, the "fan out" configuration of the interconnect 38 and interposer base 36 allow the pitch Pc (FIG. 7B) of the contacts 96 on the test socket 92, to be greater than the pitch P (FIG. 1B) of the contact balls 12 on the component 10 (i.e., Pc>P). This facilitates manufacture of the test socket 92.

Figure 8:
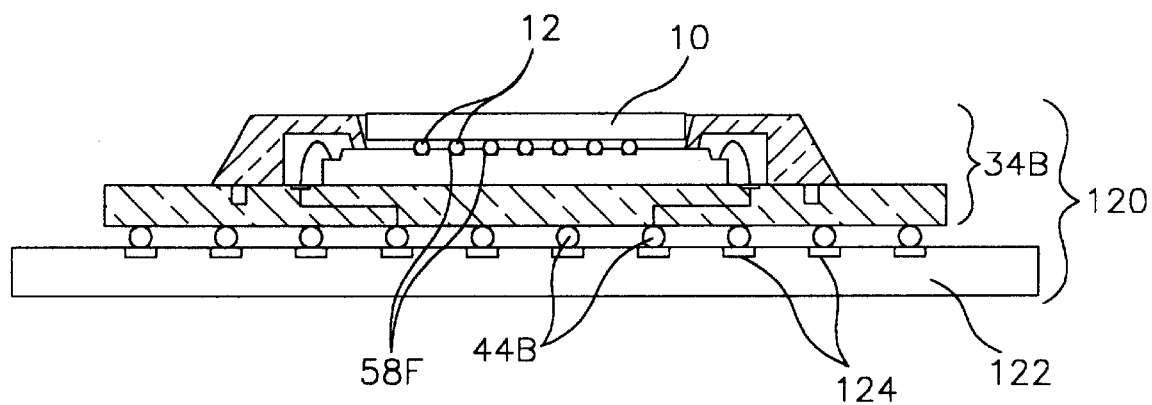
FIG. 8 is a schematic cross sectional view of an electronic assembly fabricated using an interposer constructed in accordance with the invention.

Referring to FIG. 8, an electronic assembly 120 fabricated using an alternate embodiment interposer 34B is shown. The electronic assembly 120 includes a substrate 122, such as a printed circuit board (PCB), having a plurality of contacts 124 formed thereon. The interposer 34B is surface mounted to the substrate 122 with external contacts 44B on the interposer 34B bonded to the contacts 124 on the substrate 122. In addition, the component 10 is mounted to the interposer 34B with the contact balls 12 on the component 10 bonded to the interconnect contacts 58F.

The interposer 34B is constructed substantially as previously described for interposer 34 (FIG. 3A). However, in this embodiment the interconnect contacts 58F comprise a metal configured for bonding to the contact balls 12 on the component 12. For example, with the contact balls 10 formed of solder, the interconnect contacts 58F can include an outer layer (e.g., conductive layer 72-FIG. 4A) formed of a solder wettable material, such as copper or aluminum. A solder reflow process can thus be used to bond the contact balls 12 to the interconnect contacts 58F. Similarly, the external contacts 44B on the interposer 34B can be formed of solder, and the contacts 124 on the substrate 122 formed of a solder wettable material.

The interconnect 34B can be used to configure the substrate 122 for electrical connection to the component 10. For example, the component 10 can be used to replace an outdated component that was originally surface mounted to the substrate 122.

Thus the invention provides an interposer for electrically engaging semiconductor components having contact balls. In illustrative embodiments, the interposer configures a test socket, or a substrate, for use with a particular type of semiconductor component having a particular contact ball configuration.

Although the invention has been described with reference to certain preferred embodiments, as will be apparent to those skilled in the art, certain changes and modifications can be made without departing from the scope of the invention as defined by the following claims.

I claim:

1. In a test system for testing a semiconductor component having an array of contact balls and including a socket having a plurality of contacts configured to electrically engage the contact balls, an interposer constructed to configure the socket for testing components having different arrays of contact balls, the interposer comprising:
   a base comprising an array of external contact balls configured for mating electrical engagement with the contacts on the socket; and
   an interconnect on the base comprising an array of interconnect contacts more closely spaced than, and in electrical communication with the external contact balls on the base, and configured to electrically engage the contact balls on the component;
   the interposer interchangeable with a second interposer substantially similar thereto but adapted to configure the socket for electrical communication with a second component having an array of second contact balls.

2. The interposer of claim 1 further comprising an alignment member on the base configured to align the contact balls on the component to the interconnect contacts on the interconnect.

3. The interposer of claim 1 wherein the array of contact balls on the component, the array of external contact balls on the base, and the array of second contact balls on the second component each comprise a ball grid array.

4. The interposer of claim 1 wherein the alignment member comprises a plate or a polymer layer on the interconnect having an opening configured to engage a periphery of the component.

5. In a test system for testing a semiconductor component having contact balls in a first ball grid array and including a socket having a plurality of contacts configured to electrically engage the contact balls, an interposer constructed to configure the socket for testing different components having contact balls in different arrays, the interposer comprising:
   a base comprising a plurality of external contact balls in a second ball grid array configured for mating electrical engagement with the contacts on the socket;
   an interconnect on the base comprising a plurality of interconnect contacts in electrical communication with the external contact balls on the base and configured to form temporary electrical connections with the contact balls on the component; and
   an alignment member on the base configured to align the component to the interconnect;
   the interposer interchangeable with a second interposer substantially similar thereto but adapted to configure the interposer and the socket for electrically engaging a different component having a plurality of second contact balls in a different ball grid array.

6. The interposer of claim 5 wherein the alignment member comprises a plate or a polymer layer on the base having an opening for engaging a periphery of the component.

7. The interposer of claim 5 further comprising a plurality of fan out conductors on the base in electrical communication with the interconnect contacts on the interconnect and in electrical communication with the external contact balls on the base.

8. The interposer of claim 5 wherein the interconnect contacts comprise conductive pockets configured to retain the contact balls on the component.

9. The interposer of claim 5 wherein the interconnect contacts comprise conductive pockets in an elastomeric layer configured to retain the contact balls on the component.

10. The interposer of claim 5 wherein the interconnect contacts comprise projections configured to penetrate the contact balls on the component.

11. In a test system for testing semiconductor components including a test socket having contacts for electrically engaging a semiconductor component having contact balls in a first ball grid array, an interposer constructed to configure the test socket for testing different types of semiconductor components with different ball grid arrays comprising:
    a base comprising a plurality of external contacts comprising balls in a second ball grid array with a larger pitch than the first ball grid array configured for mating electrical engagement with the contacts on the test socket;
    an interconnect on the base comprising a plurality of interconnect contacts in electrical communication with the external contacts on the base and configured to electrically engage the contact balls on the component; and
    an alignment member on the base configured to align the component to the interconnect.

12. The interposer of claim 11 wherein the contact balls on the component comprise solder balls.

13. The interposer of claim 12 wherein the external contacts on the base have a first pitch greater than a second pitch of the interconnect contacts.

14. The interposer of claim 13 wherein the component comprises a package or a die.

15. The interposer of claim 11 wherein the alignment member comprises a photoimageable polymer.

16. The interposer of claim 11 wherein the alignment member comprises a plate having an alignment opening for contacting a periphery of the component.

17. An interposer constructed to configure a test socket having a plurality of contacts in a first grid array for testing a semiconductor component having a plurality of contact balls in a second grid array comprising:
    a base configured for mounting to the test socket, the base comprising a plurality of external contacts comprising balls configured for electrical engagement with the contacts on the test socket and a plurality of fan out conductors in electrical communication with the external contacts;
    an interconnect on the base comprising a plurality of interconnect contacts in the second grid array, the interconnect contacts in electrical communication with the conductors on the base and configured to form temporary electrical connections with the contact balls on the component; and
    an alignment member on the base configured to align the component to the interconnect;
    the interposer configured for use with a second interposer constructed to configure the socket for electrical communication with a second component having a plurality of second contact balls in a third grid array.

18. The interposer of claim 17 wherein the component comprises a chip scale package.

19. The interposer of claim 18 wherein the contact balls on the component each have a diameter of about 0.127 mm to about 0.762 mm.

20. The interposer of claim 18 wherein the second grid array has a pitch of from about 0.228 mm to 2.0 mm.

21. An interposer for constructing electronic assemblies that include a substrate having a plurality of contacts and a semiconductor component having contact balls in a first grid array comprising:

a base comprising a plurality of external contacts comprising balls in a second grid array bonded to the contacts on the substrate; and an interconnect on the base comprising a plurality of second contacts in the first grid array, the second contacts in electrical communication with the external contacts on the base and configured to electrically engage the contact balls on the component;

the base and the interconnect configuring the substrate for electrical communication with the contact balls on the component, the interposer interchangeable with a second interposer substantially similar thereto but adapted to configure the substrate for electrical communication with a second component having a plurality of second contact balls in a grid array different than the first grid array.

22. The interposer of claim 21 wherein the substrate comprises a circuit board and the contacts comprise pads.

23. The interposer of claim 21 wherein the substrate and the component comprise an electronic module or a multi chip module.

24. The interposer of claim 21 wherein the first grid array, the second grid array and the grid array each comprise a ball grid array.

25. An interposer for constructing electronic assemblies that include a substrate having a plurality of contacts and a semiconductor component having a plurality of contact balls comprising:

a base comprising a plurality of external contacts comprising balls in a first ball grid array bonded to the contacts on the substrate;

an interconnect on the base comprising a plurality of second contact balls in a second ball grid array with a smaller pitch than the first ball grid array, in electrical communication with the external contacts on the base and configured to form electrical connections with the contact balls on the component; and an alignment member on the base for aligning the component to the interconnect;

the base, the interconnect and the alignment member configuring the substrate for electrically engaging the component, the interposer interchangeable with a second interposer substantially similar thereto but adapted to configure the interposer and the substrate for electrically engaging a second component having a plurality of second contact balls in a third ball grid array.

26. The interposer of claim 25 wherein the substrate comprise a circuit board or a multi chip module board.

* * * * *